(12) United States Patent
Herner (10) Patent No.: US 7,838,350 B2
(45) Date of Patent: Nov. 23, 2010

(54) BOTTOM-GATE SONOS-TYPE CELL HAVING A SILICIDE GATE

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 364 days.

(21) Appl. No.: 11/931,586

(22) Filed: Oct. 31, 2007

(65) Prior Publication Data

US 2008/0079063 A1 Apr. 3, 2008

Related U.S. Application Data

(62) Division of application No. 11/077,901, filed on Mar. 11, 2005, now Pat. No. 7,303,959.

(51) Int. Cl.
*H01L 21/84* (2006.01)
*H01L 21/8247* (2006.01)

(52) U.S. Cl. ............... 438/158; 438/257; 257/E21.179; 257/E21.561

(58) Field of Classification Search ......... 257/316–321, 257/347–354, E21.179, E21.561; 438/151–166, 438/257–267
See application file for complete search history.

(56) References Cited

U.S. PATENT DOCUMENTS

| 5,721,163 | A | * | 2/1998 | Sundaresan ................. 438/153 |
| 5,817,548 | A | | 10/1998 | Noguchi et al. |
| 5,915,167 | A | | 6/1999 | Leedy |
| 6,380,009 | B1 | * | 4/2002 | Battersby .................... 438/161 |
| 6,710,409 | B1 | | 3/2004 | Vyvoda |
| 6,713,371 | B1 | | 3/2004 | Gu |
| 6,815,781 | B2 | | 11/2004 | Vyvoda et al. |
| 6,853,049 | B2 | | 2/2005 | Herner |
| 6,858,899 | B2 | | 2/2005 | Mahajani et al. |
| 6,881,994 | B2 | | 4/2005 | Lee et al. |
| 6,960,794 | B2 | | 11/2005 | Walker et al. |
| 7,195,992 | B2 | | 3/2007 | Gu et al. |
| 2004/0002186 | A1 | | 1/2004 | Vyvoda et al. |
| 2004/0124466 | A1 | | 7/2004 | Walker et al. |

* cited by examiner

*Primary Examiner*—Richard A. Booth
(74) *Attorney, Agent, or Firm*—The Marbury Law Group, PLLC (57) ABSTRACT

A bottom-gate thin film transistor having a silicide gate is described. This transistor is advantageously formed as SONOS-type nonvolatile memory cell, and methods are described to efficiently and robustly form a monolithic three dimensional memory array of such cells. The fabrication methods described avoid photolithography over topography and difficult stack etches of prior art monolithic three dimensional memory arrays of charge storage devices. The use of a silicide gate rather than a polysilicon gate allows increased capacitance across the gate oxide.

31 Claims, 5 Drawing Sheets

BOTTOM-GATE SONOS-TYPE CELL HAVING A SILICIDE GATE

BACKGROUND OF THE INVENTION

The invention relates to a bottom-gate thin film transistor having a silicide gate.

Walker et al., U.S. patent application Ser. No. 10/335,089, "Method for Fabricating Programmable Memory Array Structures Incorporating Series-Connected Transistor Strings," filed Dec. 31, 2002, hereinafter the '089 application and hereby incorporated by reference, describes a monolithic three dimensional memory array of charge storage transistors having stacked memory levels. This arrangement of stacked memory cells results in a high-density nonvolatile memory array.

Fabrication of the memory array of the '089 application, however, presents considerable challenges, for example in photolithography and etch processes. There is a need, therefore, for a charge storage memory cell that is easily fabricated in a monolithic three dimensional memory array.

SUMMARY OF THE PREFERRED EMBODIMENTS

The present invention is defined by the following claims, and nothing in this section should be taken as a limitation on those claims. In general, the invention is directed to a bottom-gate charge storage thin film transistor, and a method for forming an array of such devices, specifically a monolithic three dimensional memory array.

A first aspect of the invention provides for a field effect transistor comprising: a first gate electrode of the transistor, wherein the first gate electrode comprises a first silicide layer; a first grown oxide layer above and in contact with the first silicide layer; and a first channel region of the transistor above the first grown oxide layer.

Another aspect of the invention provides for a bottom-gate thin film transistor semiconductor device comprising: a first amorphous or polycrystalline silicon layer; a gate electrode of the thin film transistor, wherein the gate electrode comprises a silicide layer above and in contact with the first silicon layer; a first dielectric layer above and in contact with the silicide layer; and a semiconductor channel of the transistor above the first dielectric layer.

A preferred embodiment of the invention provides for a thin film transistor memory device comprising a first gate electrode of the thin film transistor formed above a substrate, wherein the gate electrode comprises a first silicide layer formed by consuming at least a portion of an amorphous or polycrystalline silicon layer; a charge storage stack in contact with the first silicide layer; and a semiconductor channel region in contact with the charge storage stack.

Another aspect of the invention provides for a monolithic three dimensional memory array comprising: a first memory level comprising a first plurality of bottom-gate thin film transistors, wherein each transistor comprises a gate electrode comprising a salicide layer; and a second memory level comprising a second plurality of bottom-gate transistors monolithically formed above the first memory level.

A related aspect of the invention provides for a monolithic three dimensional array comprising: a) a first memory level formed above a substrate, the first memory level comprising: i) a first plurality of gate stripes, each gate stripe comprising a salicide layer and extending in a first direction; ii) a first plurality of channel stripes extending in a second direction different from the first direction, the first channel stripes formed above the first gate stripes; and b) a second memory level monolithically formed above the first memory level.

Another aspect of the invention provides for a method for making a thin film transistor semiconductor device, the method comprising the following steps: forming a first amorphous or polycrystalline silicon layer; forming a first silicide layer over and in contact with the first amorphous or polycrystalline silicon layer, wherein a first gate electrode comprises the first silicide layer; forming a first dielectric layer over and in contact with the first silicide layer; and forming an amorphous or polycrystalline silicon channel region over the first dielectric layer.

A related embodiment of the invention provides for a method for making a memory array, the method comprising: forming a plurality of first substantially parallel, substantially coplanar rails, each rail comprising a first amorphous or polycrystalline silicon layer and a first silicide layer, the first silicide layer on and in contact with the first amorphous or polycrystalline silicon layer, the first rails extending in a first direction; forming a first dielectric charge storage stack on and in contact with the first silicide layer; and forming a plurality of first substantially parallel, substantially coplanar semiconductor channels stripes, each channel stripe of the first plurality above and in contact with the first dielectric charge storage stack, the first channel stripes extending in a second direction, the second direction different from the first direction.

Still another embodiment of the invention provides for a method for making a monolithic three dimensional memory array, the method comprising: forming a first plurality of substantially parallel, substantially coplanar rails extending in a first direction and comprising polycrystalline or amorphous silicon; forming a first silicide layer on each first rail by reacting with at least a portion of the silicon; forming a dielectric charge storage stack above and in contact with the first silicide layers; forming a first plurality of substantially parallel, substantially coplanar channel stripes above the dielectric charge storage stack, the first channel stripes extending in a second direction different from the first direction, wherein a first memory level comprises the first rails and the first channel stripes; forming a second plurality of substantially parallel, substantially coplanar rails extending substantially in the first direction above the first channel stripes; and performing ion implantation of the first channel stripes to form source and drain regions, wherein the second rails serve as masks during this ion implantation step.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 1b is a cross-sectional view of the memory of FIG. 1a.

FIGS. 3a-3b and 3d-3g are cross-sectional views; FIG. 3c is a perspective view.

DETAILED DESCRIPTION OF THE PREFERRED EMBODIMENTS

The '089 application describes fabrication of a monolithic three dimensional memory array, in which multiple memory levels are vertically stacked, each built on the memory level beneath it. Each memory level is an array of charge storage transistors.

Figure 1A:
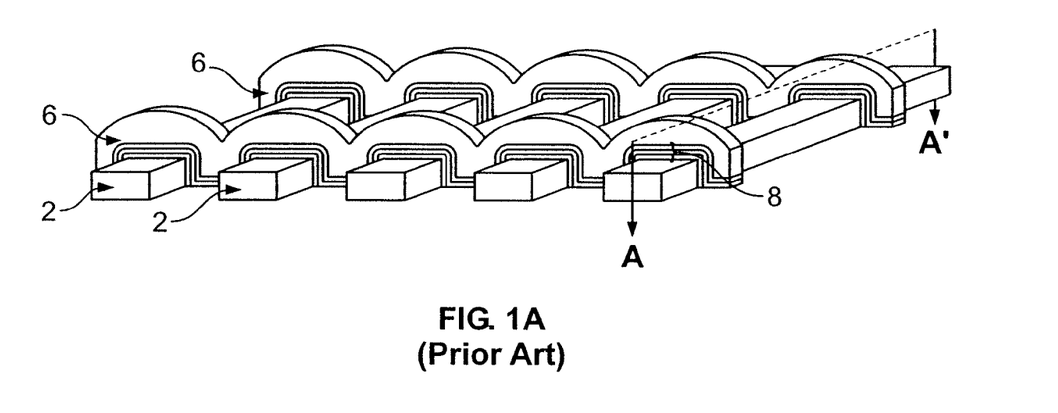
FIG. 1a is a perspective view of a portion of a prior art memory.
Figure 1B:
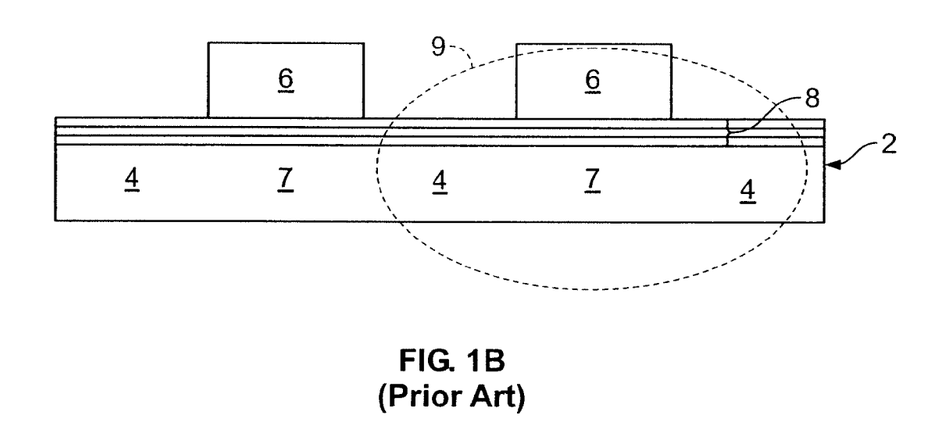

A first memory level of an embodiment of the '089 application is shown in perspective view in FIG. 1a. First channel stripes 2 are formed of polycrystalline silicon, which will be referred to in this discussion as polysilicon. The term channel stripe is used herein to mean a polysilicon layer in which one or more channel regions are formed and in which at least one source, drain, or shared source/drain may be formed. Wordlines 6 form the gate electrode for each transistor. FIG. 1b shows a channel stripe 2 in cross-section along A-A'. In this embodiment, the first channel stripe 2 comprises the channel regions 7 and shared sources and drains 4 of a plurality of series-connected thin film transistors. A transistor 9 is formed wherever wordline 6 and channel layer 2 intersect. In this embodiment an oxide-nitride-oxide stack 8 separates channel region 7 from the gate electrode formed in wordline 6. Transistor 9 is a charge-storage memory cell. When voltage is applied to the gate electrode 6 of a transistor 9, charge carriers (typically electrons) tunnel through the bottom oxide layer of oxide-nitride-oxide stack 8 and are trapped in the nitride layer. The presence or absence of stored charge can be reliably detected, and serves to distinguish a programmed cell (a "1" bit, for example) from an unprogrammed cell (a "0" bit, for example.) Such a memory cell can be erased and is rewriteable.

This cell is a SONOS memory cell. A typical SONOS memory cell consists of (in vertical sequence) a silicon channel region; a tunneling dielectric layer, typically silicon dioxide; a dielectric charge trapping layer, typically silicon nitride; a blocking dielectric layer, typically silicon dioxide; and a gate electrode, typically of silicon. The silicon-oxide-nitride-oxide-silicon stack gives the device its name. Other materials can replace some of these layers, however: Different dielectric materials can be used for the tunneling, charge storage, and blocking dielectric layers, and the gate electrode need not be silicon. The term "SONOS-type device" will be understood to mean a device that operates the same way a SONOS device operates, storing charge in a dielectric layer, but which is not necessarily limited to the materials conventionally used in a SONOS device. Mahajani et al., U.S. patent application Ser. No. 10/270,127, "Thin Film Transistor with Metal Oxide Layer and Method of Making Same," filed Oct. 15, 2002, and hereby incorporated by references, describes formation and use of SONOS-type devices made using dielectric materials other than silicon oxide and silicon nitride. Field effect transistors can be top-gate transistors, like the cell of FIG. 1b, or bottom-gate transistors, in which the channel region is above the gate electrode. SONOS-type cells can similarly have top-gate or bottom-gate structure.

Figure 2A:
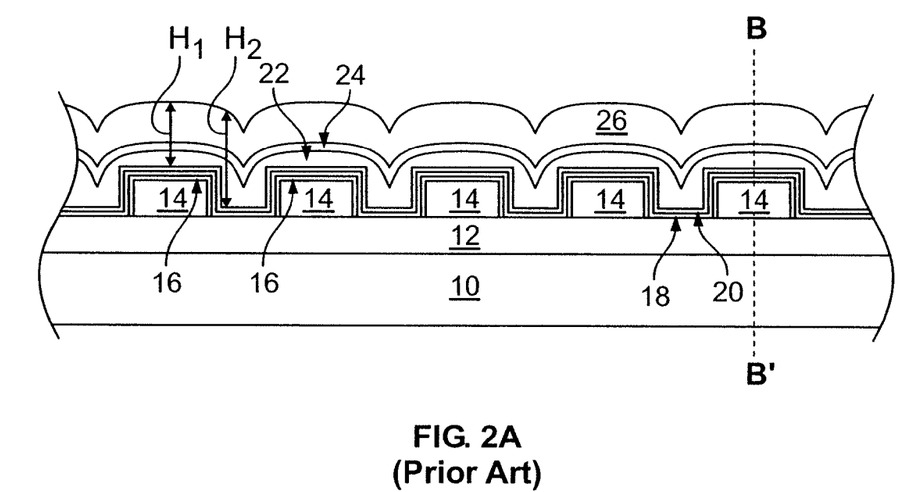
FIGS. 2a-2b are cross-sectional views illustrating fabrication of the memory of FIGS. 1a and 1b.

Formation of a first memory level of the memory array of the '089 application begins with a substrate 10 as shown in FIG. 2a. Substrate 10 is, for example, a monocrystalline silicon wafer. A dielectric layer 12 is formed on substrate 10.

A silicon layer 14 is formed on dielectric layer 12, then patterned and etched to form polysilicon channel stripes 14. Polysilicon channel stripes 14 should be undoped or lightly doped p-type polysilicon. (For simplicity, this discussion will describe formation of transistors having a p-doped channel and n-doped source and drain. It will be understood that, throughout this discussion, the polarities can be reversed.) The view of FIG. 2a is perpendicular to the view of FIG. 1b.

Next a tunneling oxide 16 is formed on channel stripes 14. This tunneling oxide 16 can be thermally grown silicon dioxide, as shown, or can be deposited. A grown silicon dioxide will only form in contact with the silicon of channel stripes 14. Charge trapping layer 18 of silicon nitride and blocking oxide layer 20 are deposited on tunneling oxide 16, forming an oxide-nitride-oxide (ONO) stack.

A heavily doped polysilicon layer 22 is deposited next, followed by a conductive layer 24. In some embodiments conductive layer 24 is titanium, which will subsequently react with polysilicon layer 22 to form low-resistivity titanium silicide. A heavily doped polysilicon layer 26 is deposited on conductive layer 24. It will be seen that polysilicon layer 22, conductive layer 24, and polysilicon layer 26 are not planar in shape; they are conformally deposited over channel stripes 14 and intervening gaps.

Figure 2B:
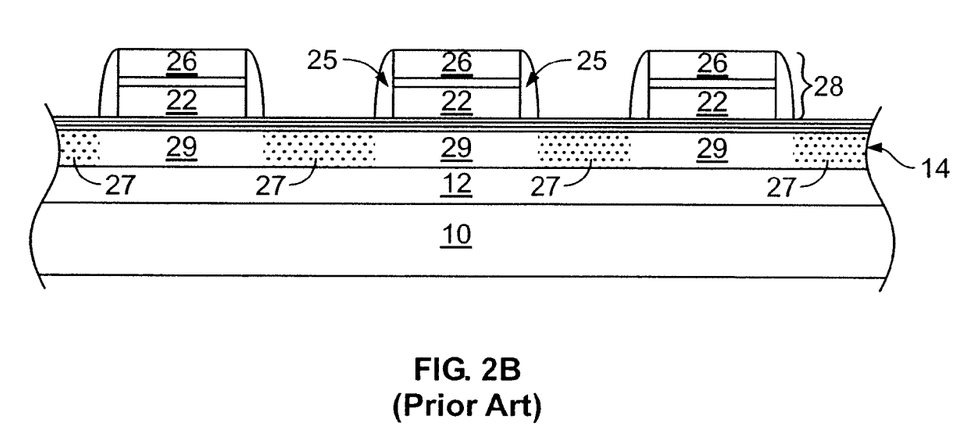

Polysilicon layer 26, conductive layer 24, and polysilicon layer 22 are patterned and etched to form gate stripes 28, as shown in FIG. 2b, which shows the structure of FIG. 2a in a cross-sectional view at ninety degrees to the view of FIG. 2a, for example along line B-B'. Gate stripes 28 preferably extend substantially perpendicular to channel stripes 14. Sidewall spacers 25 may be formed as well by any conventional method. Source/drain regions 27 are doped by ion implantation (implanted area shown by shading) using an n-type dopant. Gate stripes 28 shield channel regions 29 during this implant.

A dielectric material (not shown) is deposited over and between gate stripes 28, covering them and forming an inter-level dielectric. This dielectric material is planarized, for example by chemical mechanical planarization (CMP) to form a planar surface. Fabrication of a second memory level begins on this planar surface. Multiple stacked memory levels can be formed in this way.

Patterning and etching of gate stripes 28 involves considerable fabrication challenges. To perform the photolithographic step, a layer of photoresist is deposited on polysilicon layer 26. It will be recalled that this layer is non-planar, conforming to the contours of the channel stripes 14 below. This significant topography makes high-resolution photolithographic printing difficult. Differences in etch height, for example $H_1$ as compared to $H_2$ in FIG. 2a, make the etch challenging. Depending on the material used for conductive layer 24, differing etch rates and etch chemistries of polysilicon and, for example, titanium silicide, can make this etch problematic.

These fabrication difficulties could be solved by depositing dielectric fill on and between channel stripes 14 and planarizing, for example by CMP, to expose the tops of channel stripes 14, forming a planar surface on which to form gate stripes 28. Performance of the transistors is strongly dependent on the quality of the silicon of channel stripes 14, however, and subjecting channel stripes 14 to CMP would damage the channel silicon and degrade device performance.

The methods of the present invention provide a robust way to make a monolithic three dimensional memory array of charge storage thin film transistors which avoids photolithography over topography and difficult stack etches. A thin film transistor (TFT) formed according to the present invention is a bottom-gate TFT with a silicide gate.

A detailed example will be provided of a monolithic three dimensional memory array of bottom-gate charge storage transistors formed according to embodiments of the present invention. For completeness, specific details regarding materials, steps, and conditions will be provided. It will be understood by those skilled in the art, however, that many of these details can be modified, omitted, or augmented while the result still falls within the scope of the invention. Where relevant, details provided in the '089 application can also provide guidance; specifically, no relevant teaching of the '089 application is intended to be excluded.

Figure 3A:
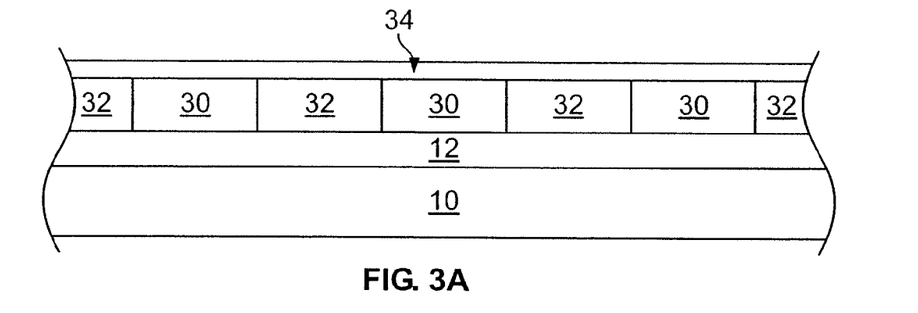
FIGS. 3a-3g illustrate stages in the fabrication of a memory according to the present invention.

Turning to FIG. 3a, fabrication begins over substrate 10 and dielectric 12. Substrate 10 is any suitable substrate, for example glass, plastic, or monocrystalline semiconductor material such as silicon. In preferred embodiments, support circuitry can be fabricated into monocrystalline silicon substrate 10 before dielectric layer 12 is formed. Dielectric layer 12 may comprise one or more layers.

First gate silicon layer 30 is deposited on dielectric 12. First gate silicon layer 30 is preferably between about 50 and about 2000 angstroms thick, most preferably about 1500 angstroms thick, and is of heavily doped n-type silicon, preferably in situ doped to a dopant concentration between about $10^{20}$ and about $10^{21}$ dopant atoms/cm$^3$. First gate silicon layer 30 can be deposited by any conventional method; for example this layer can be polycrystalline as deposited. Alternatively, layer 30 can be amorphous as deposited, then crystallized during subsequent thermal processing. First gate silicon layer 30 is patterned and etched into substantially parallel first silicon lines 30 using any conventional method.

Dielectric material 32 is deposited over and between first silicon lines 30, filling the gaps between them. Overfill of dielectric material 32 is then removed in a planarizing step, for example by CMP, to form a substantially planar surface of the exposed tops of first silicon lines 30 and intervening dielectric fill material 32.

After an optional 50 angstrom pre-sputter etch to remove any native oxide or particle defects, about 20 to about 500 angstroms, preferably about 300 to 400 angstroms, most preferably about 300 angstroms of a silicide-forming metal 34, for example cobalt, is deposited on the dielectric 32 and exposed first silicon lines 30. Cobalt layer 34 can be deposited by any conventional method, for example by sputtering. Other silicide-forming metals can be used in place of cobalt, including chromium, nickel, platinum, niobium, palladium, tantalum, or titanium. For simplicity, this description will detail the use of cobalt, but it will be understood that any of these other metals can be substituted as appropriate.

Optionally, a capping layer of about between about 50 and about 300 angstroms, preferably about 200 angstroms, preferably of titanium or titanium nitride (not shown), is deposited on cobalt layer 34. The titanium or titanium nitride cap assists in the subsequent conversion of the cobalt layer to cobalt silicide. FIG. 3a shows the structure at this point.

Figure 3B:
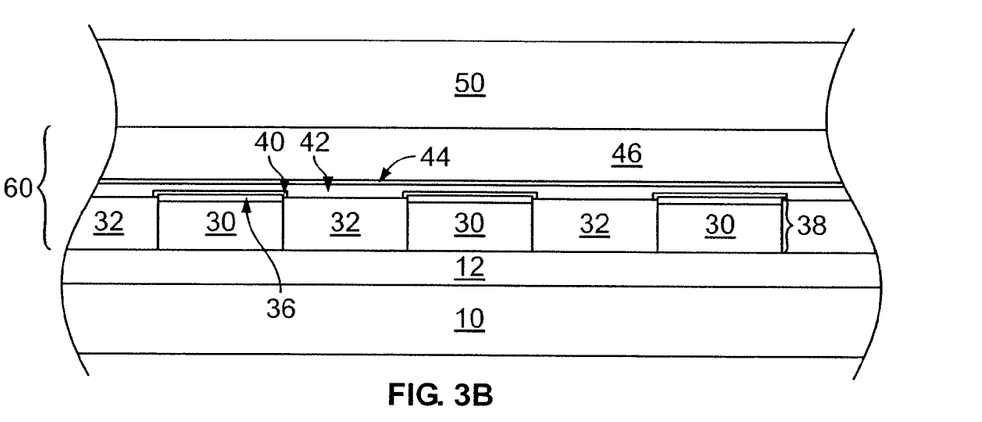

Turning to FIG. 3b, an anneal is performed at a suitable temperature to react the cobalt with the polysilicon of the exposed first silicon lines 30 to form cobalt silicide 36 on the silicon lines 30. For example, the anneal may be performed in a rapid thermal annealing system at about 400 to about 700 degrees C. for about 20 to about 100 seconds, preferably at about 500 degrees C. for about 30 seconds. The capping layer and unreacted portions of the cobalt 34 are removed by a selective etch. Any etching medium which selectively etches the capping layer and the unreacted cobalt while leaving cobalt silicide 36 may be used. Preferably, selective wet etching is used. Some thickness of the silicon lines 30 has been consumed by the silicide reaction.

A second anneal is performed to homogenize the cobalt silicide 36 to CoSi$_2$. This anneal is performed at a temperature from about 550 degrees C. to about 800 degrees C. for about 30 to about 60 seconds, preferably at about 725 degrees C. for about 30 seconds. This second anneal can be performed at any time after the first, but preferably after the removal of unreacted cobalt. In a multi-level memory array, preferably a single anneal is performed after all of the memory levels are constructed to homogenize the cobalt silicide. A first plurality of gate stripes 38 has been formed.

The remaining cobalt silicide 36 of each gate stripe 38 is a self-aligned silicide feature, also called a salicide feature. A salicide feature is a silicide feature which is formed by siliciding a silicon feature after that silicon feature has been formed by a pattern and etch step, then removing unreacted metal, leaving behind the salicide feature.

This example has described formation of cobalt silicide from cobalt and silicon. If one of the other named silicide-forming metals is used instead, the skilled practitioner will use appropriate conditions to perform this silicidation step; such conditions are well-known. If nickel is used, it may be preferred to select the thickness of nickel and silicon and reaction conditions such that all of the silicon is consumed, leaving gate stripes 38 formed entirely of nickel silicide.

Next a blocking dielectric 40 should be formed. The blocking dielectric 40 can either be deposited or can be grown by exposing cobalt silicide layer 36 to an oxidizing ambient; in preferred embodiments this layer is grown. Blocking dielectric layer 40 is preferably a silicon dioxide layer between about 20 and 200 angstroms thick, preferably about 60 angstroms thick. In a preferred embodiment, blocking dielectric 40 is a silicon dioxide layer formed by exposing silicide layer 36 to an oxygen atmosphere in a rapid thermal annealing system, preferably at about 670 to about 750 degrees C. A charge-trapping dielectric layer 42 is deposited on blocking oxide 40. Charge-trapping dielectric 42 is preferably stoichiometric or non-stoichiometric silicon nitride about 20 to about 200 angstroms thick, preferably about 90 angstroms thick. The ONO stack is completed by tunneling dielectric 44, preferably of silicon dioxide. This layer is between about 15 and about 35 angstroms thick, preferably between about 20 and about 30 angstroms thick, and is deposited by any suitable means.

Cobalt silicide 36 exists only on first silicon lines 30, as does blocking oxide layer 40 if it was grown. Creation of cobalt silicide 36, however, consumed some portion of silicon layer 30, and these layers are relatively thin, so topography is minimal. The surface of tunneling oxide 44 reflects little or no underlying topography. (The drawings are designed to illustrate concept only, and should not be presumed to correctly portray scale or aspect ratio.)

Next channel silicon 46 is deposited. Channel silicon 46 is between about 50 and about 2000 angstroms thick, and is preferably undoped or very lightly doped with a p-type dopant. Channel silicon 46 can be deposited polycrystalline or deposited amorphous and crystallized in a later step. A preferred method for forming channel silicon 46 is described in Walker et al., U.S. patent application Ser. No. 10/334,649, "Formation of Thin Channels for TFT Devices to Ensure Low Variability of Threshold Voltages," filed Dec. 31, 2002 and hereby incorporated by reference.

Methods to form large-grain polycrystalline silicon films are described in Gu, U.S. Pat. No. 6,713,371, "Large Grain Size Polysilicon Films Formed by Nuclei-Induced Solid Phase Crystallization,"; and in Gu et al., U.S. application Ser. No. 10/681,509, "Uniform Seeding to Control Grain and Defect Density of Crystallized Silicon for Use in Sub-Micron Thin Film Transistors," filed Oct. 7, 2003, both hereby incorporated by reference. In preferred embodiments, these methods may advantageously be used to form and crystallize channel silicon 46.

Channel silicon 46 is patterned and etched using any conventional method to form channel stripes 46. Silicon and cobalt silicide have very high etch selectivity, so cobalt silicide 36 provides a good etch stop during this etch. Channel stripes 46 should extend in a direction different from the direction of gate stripes 38, preferably perpendicular to them.

Figure 3C:
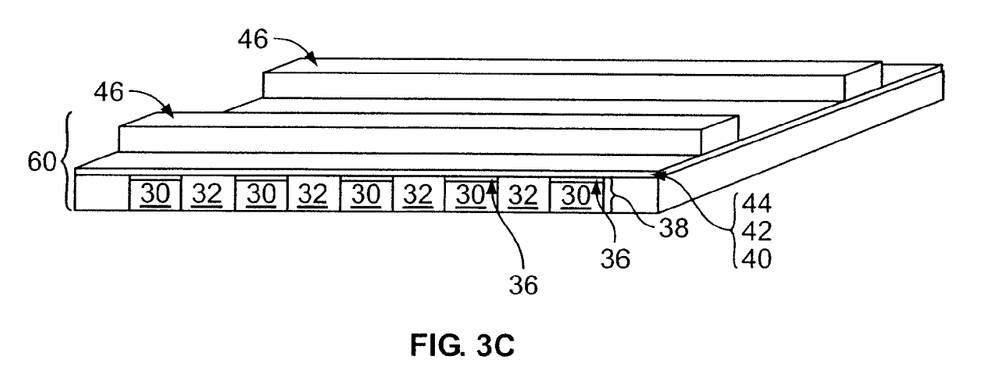

A dielectric material 50, for example HDP oxide is deposited over and between channel stripes 46, overfilling to form an interlevel dielectric. The interlevel dielectric is planarized, for example by CMP. This planarization step should not expose the tops of the channel stripes 46; a thickness of interlevel dielectric should remain, for example about 1000 angstroms. Heavily doped source/drain regions are yet to be formed in channel stripes 46, as will be described below. Elements of a first memory level 60 have been formed. FIG. 3c shows a perspective view of memory level 60. (Dielectric material 50 is not shown in FIG. 3c.)

Figure 3D:
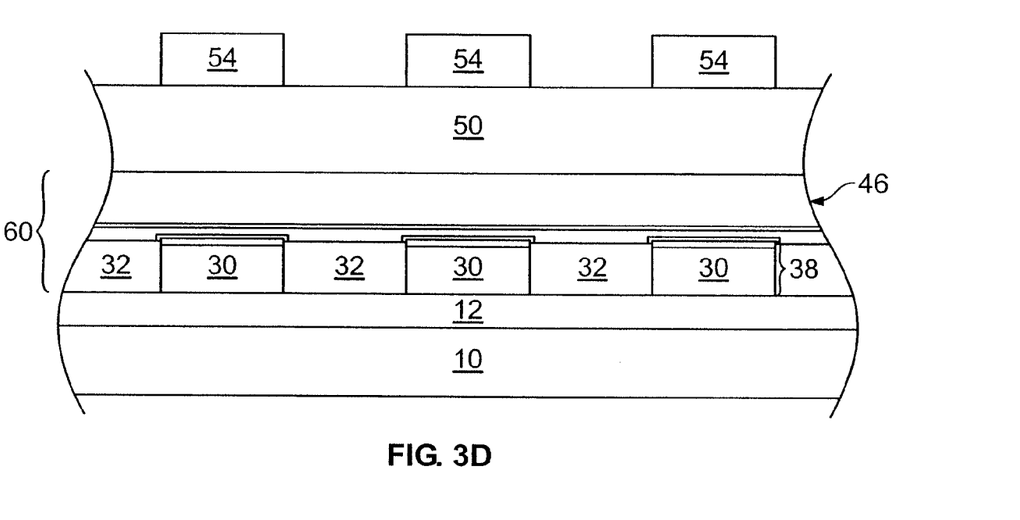

Turning to FIG. 3d, fabrication of the next memory level begins. Second gate silicon layer 54 is deposited on planarized interlevel dielectric 50. Second gate silicon layer 54 can be deposited undoped or doped with an n-type dopant. As in first memory level 60, gate silicon layer 54 is patterned and etched to form second silicon lines 54. Second silicon lines 54 should extend in substantially the same direction as first gate stripes 38 and should be substantially aligned with them; i.e. each second silicon line 54 should be immediately above a first gate stripe 38.

Second silicon lines 54 are doped by ion implantation with an n-type dopant, preferably arsenic. Implant direction is shown by arrows and implanted areas by shading in FIG. 3e. This implant step serves to heavily dope the second silicon lines 54 and, at the same time, to form heavily doped source/drain regions 56 in first channel stripes 38. During this implant step, second silicon lines 54 and source/drain regions 56 are preferably doped to a dopant concentration between about $10^{20}$ and about $10^{21}$ dopant atoms/cm$^3$. The channel regions 58 of channel stripes 38 are shielded from ion implantation by the second silicon lines 54 and are not doped in this implant step.

Figure 3E:
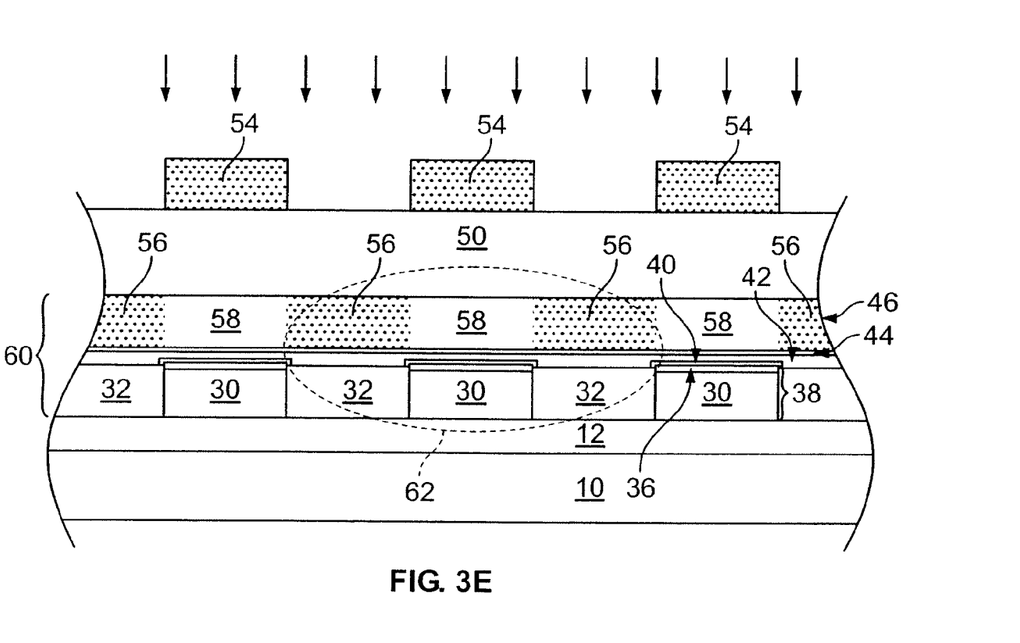
Figure 3F:
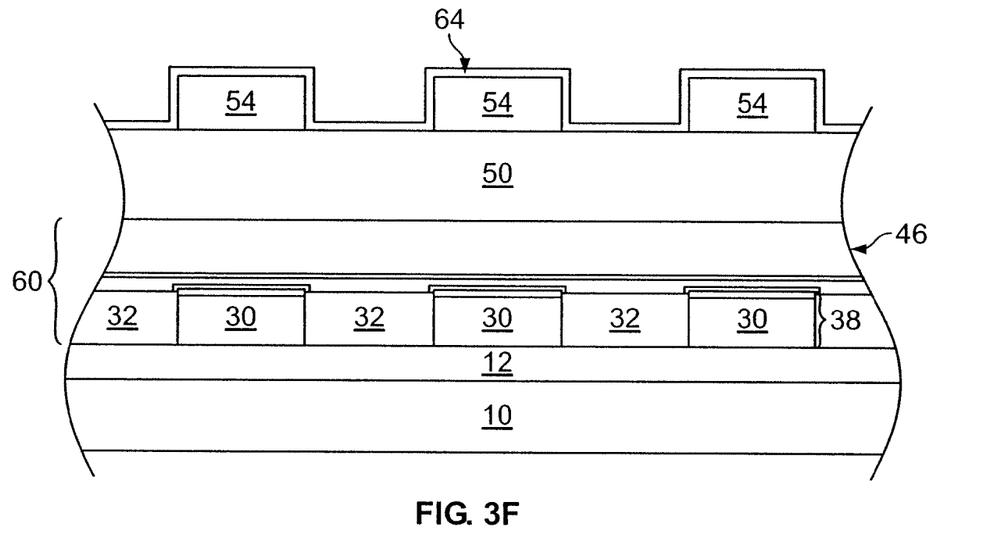
Figure 3G:
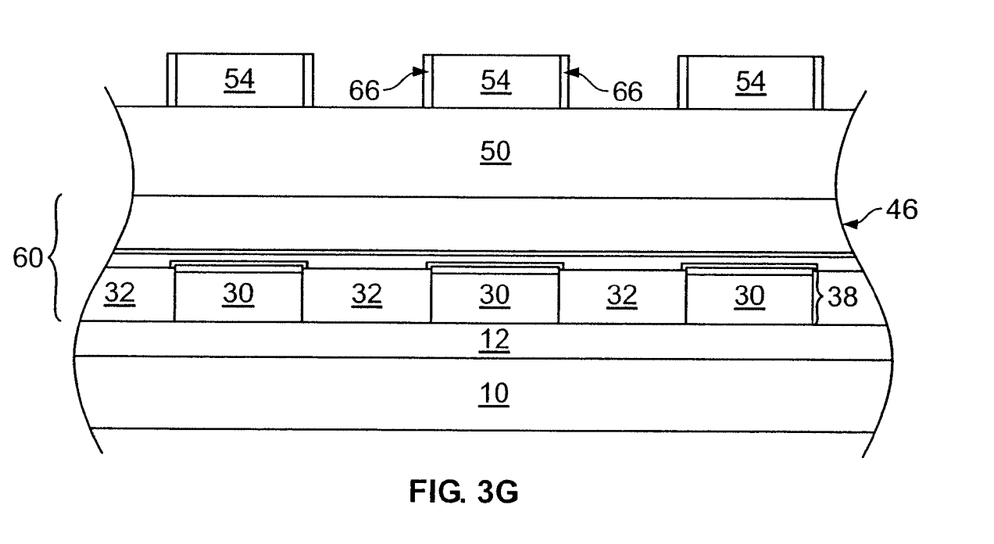

If second silicon lines 54 and first gate stripes 38 are significantly misaligned, some portion of channel regions 58 may unintentionally be doped, which will compromise performance of the transistor. If desired, dielectric spacers can be formed surrounding second silicon lines 54, effectively providing a wider "shadow" during the ion implantation step and improving misalignment tolerance. For example, after etch of second silicon lines 54 and before the ion implantation is performed, a thin layer 64 of a dielectric material, for example silicon dioxide or silicon nitride, can be deposited, as shown in FIG. 3f. A short anisotropic etch removes dielectric 64 from horizontal surfaces, leaving spacers 66, shown in FIG. 3g. The width of spacers 66 at the bottom is preferably about 200 angstroms.

In an alternative embodiment, it may be desirable to deposit channel silicon 46, deposit photoresist on channel silicon 46, pattern and develop the photoresist, and perform ion implantation using the photoresist as a mask. This ion implantation step using photoresist as a mask (rather than second silicon lines 54) can be performed either before or after channel silicon 46 is patterned into channel stripes.

Returning to FIG. 3e, the first memory level 60 of charge storage transistors has been formed. Each bottom-gate transistor 62 has a cobalt silicide gate electrode 36, a charge storage dielectric (of blocking oxide 40, charge trapping nitride 42, and tunneling oxide 44), a channel region 58, and source/drain regions 56. Each channel stripe 30 comprises a plurality of series-connected transistors in a NAND string.

To summarize, transistor 62 is a bottom-gate thin film transistor semiconductor device comprising a first amorphous or polycrystalline silicon layer; a gate electrode of the thin film transistor, wherein the gate electrode comprises a silicide layer above and in contact with the first silicon layer; a first dielectric layer above and in contact with the silicide layer; and a semiconductor channel of the transistor above the first dielectric layer. More specifically, thin film transistor memory device comprising a first gate electrode of the thin film transistor formed above a substrate, wherein the gate electrode comprises a first silicide layer formed by consuming at least a portion of an amorphous or polycrystalline silicon layer; a charge storage stack in contact with the first silicide layer; and a semiconductor channel region in contact with the charge storage stack.

The same methods as described previously are used to form additional stacked memory levels above this one. After dielectric fill and planarization, cobalt silicide (or any of the other named silicides) is formed on second silicon lines 54 in a salicide step. An ONO stack is formed, second channel silicon is deposited, patterned, etched, and so on.

When the channel stripes for the final, top memory level are to be doped, clearly no next memory level exists, and thus no next-level gate stripe can be used as a mask during the implant step, as in each previous memory level. To perform this doping step, photoresist should be deposited on the channel silicon, then patterned and developed to expose the source/drain regions. Ion implantation is then performed using the photomask as a mask. This step can be performed either before or after patterning and etching of the channel silicon into channel stripes.

This discussion has described a method for making a memory array, the method comprising forming a plurality of first substantially parallel, substantially coplanar rails, each rail comprising a first amorphous or polycrystalline silicon layer and a first silicide layer, the first silicide layer on and in contact with the first amorphous or polycrystalline silicon layer, the first rails extending in a first direction; forming a first dielectric charge storage stack on and in contact with the first silicide layer; forming a plurality of first substantially parallel, substantially coplanar semiconductor channels stripes, each channel stripe of the first plurality above and in contact with the first dielectric charge storage stack, the first channel stripes extending in a second direction, the second direction different from the first direction.

To summarize, the first rails can be formed by depositing the first amorphous or polycrystalline silicon layer; patterning and etching the first amorphous or polycrystalline silicon layer to form first amorphous or polycrystalline silicon lines; depositing dielectric fill over and between the first amorphous or polycrystalline silicon lines; removing overfill of the dielectric fill; and planarizing to form a substantially planar surface exposing tops of the first amorphous or polycrystalline silicon lines.

A monolithic three dimensional memory array formed according to embodiments of the present invention comprises a first memory level comprising a first plurality of bottom-gate thin film transistors, wherein each transistor comprises a gate electrode comprising a salicide layer; and a second memory level comprising a second plurality of bottom-gate transistors monolithically formed above the first memory level. More specifically, such a memory comprises a) a first memory level formed above a substrate, the first memory level comprising: i) a first plurality of gate stripes, each gate stripe comprising a salicide layer and extending in a first direction; ii) a first plurality of channel stripes extending in a second direction different from the first direction, the first channel stripes formed above the first gate stripes; and b) a second memory level monolithically formed above the first memory level.

There are several advantages to the methods fabrication described. Field effect transistors having doped polysilicon gates suffer from the polysilicon gate depletion effect, in which applied bias to the gate fully depletes the gate of charge due to inadequate charge carrier concentration. This gate depletion leads to an increase in total effective gate dielectric thickness, reducing the inversion capacitance of the device, thus reducing the drive current of the device. The cobalt silicide gate of field effect transistor 62 avoids this problem, allowing higher capacitance across the gate dielectric (layers 40, 42, and 44) for the same applied voltage.

Using the gate stripe from the level above as a mask during ion implantation when forming the source/drain regions of the current level saves a masking step.

If the methods of the present invention are used to form a non-memory cell, an additional advantage emerges. As noted above, silicon dioxide can be thermally grown on some silicides, for example cobalt silicide. Thus in a non-memory embodiment of the present invention, the ONO stack of the memory transistor 62 described above can be replaced by a grown silicon dioxide layer. Such a transistor is not a charge-storage device. In general, a grown oxide is measurably different from a deposited oxide of the same material. The grown oxide layer has fewer defects and is generally denser than a corresponding deposited oxide and forms a higher quality gate oxide. Further, a grown oxide can reliably be produced thinner than can a corresponding deposited oxide. Oxides of 50 angstroms or less, for example, can be grown, while it is very difficult or impossible to reliably deposit an oxide this thin. A grown oxide is also preferable in that processing to produce it is simpler and less costly than for a deposited oxide.

For purposes of this discussion, a silicon dioxide layer grown on a silicon-containing surface is one in which a portion of the underlying silicon-containing surface is converted to silicon dioxide by exposing the surface to an oxygen-containing ambient. In contrast to a grown silicon dioxide layer, a deposited silicon dioxide layer is formed on a surface by providing silicon and oxygen atoms to the surface. For example, a silicon dioxide layer is deposited by chemical vapor deposition (CVD) or sputtering.

To summarize, the transistor of both the memory and non-memory embodiments described herein is a field effect transistor comprising a first gate electrode of the transistor, wherein the first gate electrode comprises a first silicide layer; a first grown oxide layer above and in contact with the first silicide layer; and a first channel region of the transistor above the first grown oxide layer.

The methods of the present invention have been described in the context of a monolithic three dimensional memory array, but clearly these methods could find utility in non-memory uses. An array of bottom-gate transistors having a silicide gate formed according to the present invention could also be formed in a single device level, without additional levels stacked above the first level.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or more memory levels can be formed above the substrate in such a multilevel array.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A field effect transistor comprising:
    a first gate electrode of the transistor, wherein the first gate electrode comprises a first silicide layer;
    a blocking dielectric layer comprising a first grown oxide layer above and in contact with the first silicide layer;
    a dielectric charge storage layer above the blocking dielectric layer;
    a tunneling dielectric layer above the dielectric charge storage layer; and
    a first channel region of the transistor above the first grown oxide layer.

2. The field effect transistor of claim 1 wherein the first silicide layer comprises a silicide selected from a group consisting of cobalt silicide, chromium silicide, tantalum silicide, platinum silicide, nickel silicide, niobium silicide, and palladium silicide.

3. The field effect transistor of claim 1 wherein the first silicide layer is formed by reacting with amorphous or polycrystalline silicon.

4. The field effect transistor of claim 1 wherein a second gate electrode of a second transistor is disposed above the first channel region.

5. The field effect transistor of claim 4 wherein the second gate electrode comprises a second silicide layer.

6. The field effect transistor of claim 1 wherein the field effect transistor is a portion of a memory array.

7. The field effect transistor of claim 6 wherein the memory array is a monolithic three dimensional memory array.

8. A bottom-gate thin film transistor semiconductor device comprising:
    a first amorphous or polycrystalline silicon layer;
    a gate electrode of the thin film transistor, wherein the gate electrode comprises a silicide layer above and in contact with the first silicon layer;
    a blocking dielectric layer above and in contact with the silicide layer;
    a charge storage layer above the blocking dielectric layer;
    a tunneling dielectric layer above the charge storage layer; and
    a semiconductor channel of the transistor above the first dielectric layer.

9. The bottom-gate transistor of claim 8 wherein the silicide layer is selected from a group consisting of cobalt silicide, chromium silicide, titanium silicide, tantalum silicide, platinum silicide, nickel silicide, niobium silicide, and palladium silicide.

10. The bottom-gate transistor of claim 8 wherein the charge storage layer comprises a dielectric charge storage layer.

11. The bottom-gate transistor of claim 8 wherein a memory cell comprises the transistor.

12. The bottom-gate transistor of claim 11 wherein the memory cell is a portion of a memory array.

13. The bottom-gate transistor of claim 12 wherein the memory array is a monolithic three dimensional memory array.

14. The bottom-gate transistor of claim 8 wherein the blocking dielectric layer is a grown oxide.

15. A thin film transistor memory device comprising:
   a first gate electrode of the thin film transistor formed above a substrate, wherein the gate electrode comprises a first silicide layer formed by consuming at least a portion of an amorphous or polycrystalline silicon layer;
   a charge storage stack in contact with the first silicide layer; and
   a semiconductor channel region in contact with the charge storage stack.

16. The thin film transistor of claim 15 wherein the charge storage stack is over the gate electrode and the semiconductor channel region is over the charge storage stack.

17. The thin film transistor of claim 16 wherein the charge storage stack comprises:
   a blocking dielectric layer;
   a dielectric charge storage layer; and
   a tunneling dielectric layer.

18. The thin film transistor of claim 17 wherein the blocking dielectric layer is a grown oxide.

19. The thin film transistor of claim 15 wherein a memory cell comprises the transistor.

20. The thin film transistor of claim 19 wherein the memory cell is a portion of a first memory level of memory cells, the first memory level formed at a first height above the substrate.

21. The thin film transistor of claim 20 wherein the first memory level is a portion of a monolithic three dimensional memory array.

22. The thin film transistor of claim 20 wherein the substrate comprises monocrystalline silicon.

23. A monolithic three dimensional memory array comprising:
   a first memory level comprising a first plurality of bottom-gate thin film transistors, wherein each transistor comprises a gate electrode comprising a silicide layer; and
   a second memory level comprising a second plurality of bottom-gate transistors monolithically formed above the first memory level;
   wherein each of the first plurality of bottom-gate thin film transistors further comprises:
   a dielectric charge storage stack; and
   a channel region;
   wherein the silicide layer of each of the first plurality of bottom-gate thin film transistors is in contact with the dielectric charge storage stack.

24. The monolithic three dimensional memory array of claim 23 wherein each silicide layer is formed by consuming at least a portion of an amorphous or polycrystalline silicon layer.

25. The monolithic three dimensional memory array of claim 23 wherein each of the first bottom-gate thin film transistors comprises source and drain regions doped by ion implantation.

26. The monolithic three dimensional memory array of claim 25 wherein at least some of the first bottom-gate thin film transistors are NAND-connected in a series string.

27. The monolithic three dimensional memory array of claim 23 wherein the first memory level is formed above a substrate, the substrate comprising monocrystalline silicon.

28. A monolithic three dimensional array comprising:
   a) a first memory level formed above a substrate, the first memory level comprising:
      i) a first plurality of gate stripes, each gate stripe comprising a silicide layer and extending in a first direction;
      ii) a first plurality of channel stripes extending in a second direction different from the first direction, the first channel stripes formed above the first gate stripes;
      iii) a charge storage stack contacting the silicide layer and located between the first plurality of gate stripes and the first plurality of channel stripes; and
   b) a second memory level monolithically formed above the first memory level.

29. The monolithic three dimensional array of claim 28 wherein the silicide comprises a silicide selected from the group consisting of cobalt silicide, chromium silicide, titanium silicide, tantalum silicide, platinum silicide, nickel silicide, niobium silicide, and palladium silicide.

30. The monolithic three dimensional array of claim 28 wherein each of the first channel stripes comprises a plurality of series connected channel regions and source/drain regions.

31. The monolithic three dimensional array of claim 30 wherein the source/drain regions are doped by ion implantation.

* * * * *